(12) United States Patent
Kanemaru

(10) Patent No.: US 9,276,400 B2
(45) Date of Patent: Mar. 1, 2016

(54) PROTECTION CIRCUIT

(71) Applicant: Panasonic Corporation, Osaka (JP)

(72) Inventor: Masaki Kanemaru, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/236,433

(22) PCT Filed: Dec. 11, 2012

(86) PCT No.: PCT/JP2012/007909
§ 371 (c)(1),
(2) Date: Jan. 31, 2014

(87) PCT Pub. No.: WO2013/102971
PCT Pub. Date: Jul. 11, 2013

(65) Prior Publication Data
US 2014/0168834 A1 Jun. 19, 2014

(30) Foreign Application Priority Data

Jan. 5, 2012 (JP) .................................. 2012-000795

(51) Int. Cl.
H02H 9/00 (2006.01)
H02H 9/04 (2006.01)
H01L 27/02 (2006.01)

(52) U.S. Cl.
CPC ........... *H02H 9/041* (2013.01); *H01L 27/0288* (2013.01)

(58) Field of Classification Search
USPC .......................................... 361/56
See application file for complete search history.

(56) References Cited

U.S. PATENT DOCUMENTS

| 2005/0057305 | A1* | 3/2005 | Krone ........................... 330/254 |
| 2006/0141944 | A1 | 6/2006 | Shibagaki et al. |
| 2007/0159246 | A1 | 7/2007 | Sugiura et al. |
| 2008/0112101 | A1 | 5/2008 | McElwee et al. |
| 2008/0139158 | A1* | 6/2008 | Chang et al. ................... 455/311 |
| 2009/0154038 | A1* | 6/2009 | Dunnihoo et al. ............... 361/56 |

(Continued)

FOREIGN PATENT DOCUMENTS

| JP | 2006-186596 A | 7/2006 |
| JP | 2007-201445 A | 8/2007 |

(Continued)

OTHER PUBLICATIONS

International Search Report for application No. PCT/JP2012/007909 dated Feb. 19, 2013.

*Primary Examiner* — Ronald W Leja
(74) *Attorney, Agent, or Firm* — Pearne & Gordon LLP

(57) ABSTRACT

A protection circuit includes a transformer (11), wherein a terminal (11*a*) of the transformer (11) is connected to a terminal part (1) of a radio IC, a terminal (11*b*) thereof is connected to a grounding point, a terminal (11*c*) thereof is connected to an input or output of an on-chip circuit (7), and a terminal (11*d*) thereof is connected to a bias power supply circuit (18). A signal is transmitted between a terminal-side inductor (11*f*) and a circuit-side inductor (11*g*) due to magnetic coupling therebetween. The terminal-side inductor and the circuit-side inductor are insulated to each other from a standpoint of DC and hence isolated completely to each other. Thus, different voltages can be applied to the terminal part (1) and the input or output of the on-chip circuit (7), respectively.

7 Claims, 13 Drawing Sheets

(56) References Cited

U.S. PATENT DOCUMENTS

| | | | |
|---|---|---|---|
| 2009/0189182 A1* | 7/2009 | Hodel et al. | 257/173 |
| 2009/0289721 A1* | 11/2009 | Rajendran et al. | 330/301 |
| 2010/0041361 A1* | 2/2010 | Ojo | 455/334 |
| 2010/0067154 A1* | 3/2010 | Deng et al. | 361/56 |
| 2010/0201457 A1* | 8/2010 | Lee et al. | 333/117 |
| 2010/0219890 A1* | 9/2010 | Crand | 330/188 |
| 2011/0254123 A1* | 10/2011 | Sellathamby et al. | 257/531 |
| 2011/0291819 A1 | 12/2011 | Kaeriyama | |
| 2014/0162551 A1* | 6/2014 | Boyle et al. | 455/41.1 |
| 2014/0266470 A1* | 9/2014 | Maxim et al. | 330/307 |

FOREIGN PATENT DOCUMENTS

| | | |
|---|---|---|
| JP | 2011-211592 A | 10/2011 |
| WO | 2010-095368 A1 | 8/2010 |
| WO | 2010-119625 A1 | 10/2010 |

* cited by examiner (a)

(b)

PROTECTION CIRCUIT

TECHNICAL FIELD

The present disclosure relates to a protection circuit provided in an electronic circuit. For example, the present disclosure relates to a protection circuit for preventing the breakage of a circuit due to disturbance containing electro-static discharge (ESD) in an electronic circuit for inputting a radio frequency signal.

BACKGROUND ART

In an electronic circuit for inputting a radio frequency signal, for example, the IC (integrated circuit) of a radio circuit is provided with a protection circuit for preventing the breakage of a circuit due to electro-static discharge. FIG. 10 is a circuit diagram showing an example of the configuration in which an ESD protection circuit is provided at the radio frequency signal input part of the reception block of a radio circuit.

A low noise amplifier (LNA) 102 is connected to the latter stage of a terminal part (pad) 101 for inputting a signal from the outside. In the example of FIG. 10, in order to prevent the amplitude of the input signal from increasing to an allowable voltage value or more due to electro-static discharge, an ESD diode circuit 103 acting as an ESD protection circuit is inserted between the terminal part 101 and the low noise amplifier 102.

In the ESD diode circuit 103, two diodes 103a, 103b are connected in series, the cathode of the diode 103a is connected to a power supply, and the anode of the other diode 103b is connected to the ground (GND). When the input signal changes to the positive voltage side due to electro-static discharge, the diode 103a is switched into an ON state to thereby flow a current into the diode 103a, thereby preventing the input signal amplitude from increasing to the power supply voltage or more. In contrast, when the input signal changes to the negative voltage side, the diode 103b is switched into an ON state to thereby flow a current into the diode 103b, thereby preventing the input signal amplitude from reducing to the ground voltage or less.

However, each of the diodes 103a, 103b constituting the ESD diode circuit 103 has a parasitic capacitance. In the case of providing the ESD diode circuit 103, the parasitic capacitance of the diode could be a factor for degrading the transmission characteristics of a reception signal. In a radio circuit treating a microwave signal of several GHz as an input signal, the technique of reducing the parasitic capacitance of the ESD diode circuit has been investigated in order to suppress the influence on the transmission characteristics.

The higher the frequency becomes, the larger the influence of the parasitic capacitance becomes. For example, in the case of treating a millimeter wave signal of several tens GHz which is ten times or more of the microwave band, the influence of the parasitic capacitance increases. Thus, in the radio circuit of the millimeter wave band, it is difficult to eliminate the degradation of the transmission characteristic due to the parasitic capacitance.

As a solution for eliminating the problem caused by the parasitic capacitance of the diode, there has been proposed an ESD protection circuit using transmission lines (see Patent Literature 1). FIG. 11 is a circuit diagram showing a first example of the ESD protection circuit described in Patent Literature 1, and FIG. 12 is a circuit diagram showing a second example of the ESD protection circuit described in Patent Literature 1.

The first example of FIG. 11 includes a transmission line 154 for connecting a terminal part (pad) 151 and a grounding point, a transmission line 155 for connecting the input of an on-chip circuit (low noise amplifier, for example) 157 and a bias power supply circuit 168, and a capacitor 156 for connecting the terminal part 151 and the input of the on-chip circuit 157.

Since the impedance of the transmission line 154 is high in the millimeter wave band, a signal passes toward the on-chip circuit 157 from the terminal part 151. On the other hand, a signal generated by electro-static discharge has a frequency sufficiently lower than the millimeter wave band. Since the impedance of the transmission line 154 becomes low with respect to an electro-static discharge signal of the low frequency, the protection circuit shows characteristics similar to that in the case where the signal path and the grounding point is short-circuited therebetween. Thus, the transmission of the electrostatic discharge signal to the on-chip circuit 157 can be suppressed.

The second example of FIG. 12 shows a configuration in which both the transmission line 154 and the capacitor 156 of FIG. 11 are not provided. In this example, the ESD diode circuit 103 and a resistor 159 are connected between the transmission line 155 and the bias power supply circuit 168, one end of a capacitor 158 is connected to a connection point between the transmission line 155 and the ESD diode circuit 103, and the other end of the capacitor 158 is grounded.

Since the impedance of the transmission line 155 is high in the millimeter wave band, the influence on the signal path due to the parasitic capacitance of the ESD diode circuit 103 can be suppressed. Since the impedance of the transmission line 155 becomes low with respect to the electro-static discharge signal of the low frequency, the protection circuit shows characteristics similar to those in the case where the signal path and the ESD diode circuit 103 are connected. Thus, the signal amplitude can be suppressed by the ESD diode circuit 103 when electro-static discharge occurs.

CITATION LIST

Patent Literature

Patent Literature 1: US 2008/0112101 A1

SUMMARY OF INVENTION

Technical Problem

An object of the present disclosure is to, in a protection circuit, suppress degradation of performance due to a parasitic capacitance to thereby improve protection function without increasing an occupancy area.

Solution to Problem

A protection circuit according to the present disclosure includes: a transformer which is provided between a terminal part of an electronic circuit and an input or output of the electronic circuit, the transformer including a plurality of inductors magnetically coupled therebetween, wherein one end and the other end of a terminal-side inductor of the transformer are connected to the terminal part and a ground, respectively, and one end and the other end of a circuit-side inductor of the transformer are connected to the input or output of the electronic circuit and a bias power supply circuit of the electronic circuit, respectively.

A protection circuit according to the present disclosure includes: a transformer which includes, between a terminal part of an electronic circuit and an input or output of the electronic circuit, a plurality of inductors magnetically coupled therebetween, wherein one end and the other end of a terminal-side inductor of the transformer are connected to the terminal part and a ground, respectively, the electronic circuit is a circuit of a differential configuration, and a circuit-side inductor of the transformer has a midpoint terminal, one end of the circuit-side inductor is connected to an input or output of one electronic circuit of the differential configuration, the other end of the circuit-side inductor is connected to an input or output of the other electronic circuit of the differential configuration, and the midpoint terminal is connected to a bias power supply circuit of the electronic circuit.

According to the above configuration, a signal is transmitted between the terminal-side inductor and the circuit-side inductor of the transformer due to the magnetic coupling therebetween. However, the terminal-side inductor and the circuit-side inductor are insulated to each other from a standpoint of DC and hence isolated to each other. Thus, since the DC voltage at each of the terminal part and the outside of the electronic circuit can be isolated from the DC voltage at the input/output of the electronic circuit, the voltage at the terminal part and the bias voltage of the electronic circuit can be isolated to each other without using a capacitor to be connected in series in a signal path. Further, since the impedance can be made low with respect to a signal of a frequency lower than the frequency band of a signal generated by electro-static discharge, the electro-static discharge signal can be flown into the grounding point from the other end of the terminal-side inductor of the transformer, thereby preventing the discharge signal from flowing into the electronic circuit-side.

Advantageous Effects of Invention

According to the present disclosure, in the protection circuit, the degradation of performance due to the parasitic capacitance can be suppressed and the protection function can be improved without increasing the occupancy area.

MODES FOR CARRYING OUT INVENTION (Background for Aspects of the Disclosure)

Figure 11:
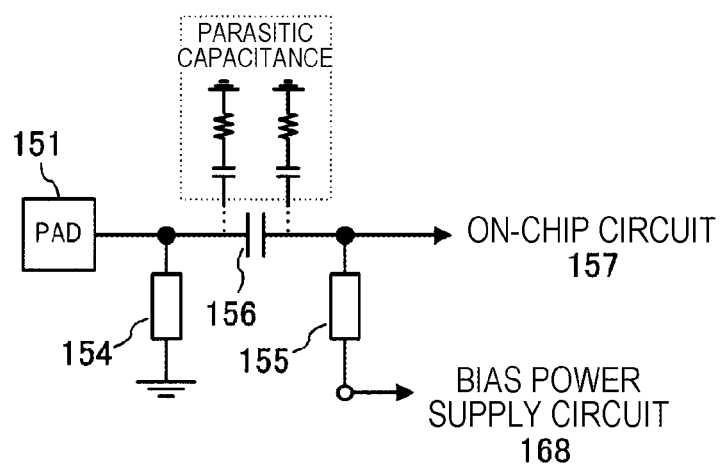
FIG. 11 is a circuit diagram showing a first example of an ESD protection circuit described in Patent Literature 1.
Figure 12:
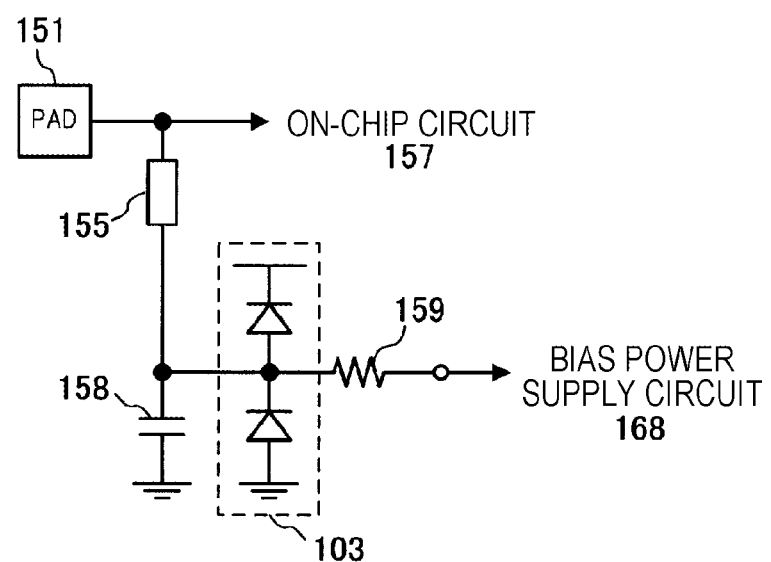
FIG. 12 is a circuit diagram showing a second example of the ESD protection circuit described in Patent Literature 1.

In the first example shown in FIG. 11 and the second example shown in FIG. 12 as examples of the ESD protection circuit, each of the transmission lines 154, 155 acts as a part of the input matching circuit for the on-chip circuit 157. In the actual circuit, elements such as a transmission line(s), a resistor(s), a capacitor(s), an inductor (s) are additionally connected between the terminal part 151 and the on-chip circuit 157, as needed.

The technique proposed by Patent Literature 1 shown in FIGS. 11 and 12 has the following problem. The capacitor 156 used in the first example of FIG. 11 is desired to have a sufficiently large capacitance in a view point of enlarging the band width of the matching circuit. On the other hand, when a large capacitance is mounted on the IC, the parasitic capacitance becomes large with respect to a substrate, which results in a cause of signal loss. In the second example of FIG. 12, since the protection circuit is realized without using the capacitor 156, degradation of characteristic due to the parasitic capacitance does not occur. However, since the DC voltage at the terminal part 151 and the DC voltage at the input of the on-chip circuit 157 become same, it is necessary to provide a capacitance element for isolating these DC voltages, at the outside of the IC. Thus, a mounting cost may increase.

Figure 13:
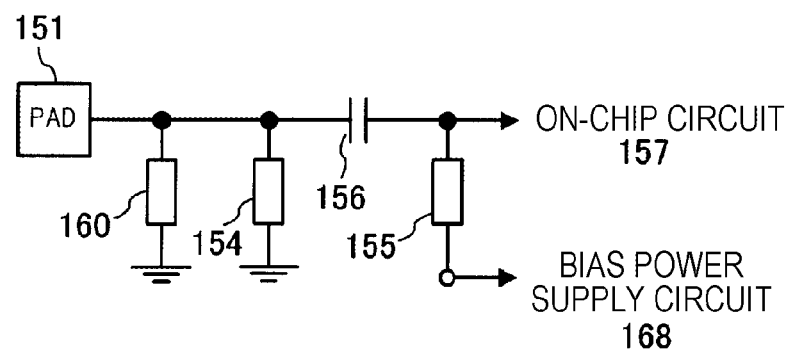
FIG. 13 shows an example of an ESD protection circuit of the related art in which a withstand voltage is considered.

Further, in the configuration shown in each of FIGS. 11 and 12, although the single transmission line for ESD protecting is provided, there is a case that the single transmission line is not enough for obtaining sufficient resistance characteristic with respect to electro-static discharge. Then, it is necessary to connect similar transmission lines in parallel, which results in the increase of an occupancy area. Incidentally, in the configuration of FIG. 11, the withstand voltage of the capacitor 156 is also required to be taken into consideration. In FIG. 13, in view of the withstand voltage, a new transmission line 160 is connected at a point closer to the terminal part 151 than the capacitor 156.

In view of the above circumstances, the present disclosure provides a protection circuit which can suppress degradation of performance due to the parasitic capacitance of a circuit to thereby improve protection function without increasing the occupancy area. Further, the present disclosure provides the protection circuit which can isolate between the voltage of a terminal part and the bias voltage of an electronic circuit without using a capacitor connected in series with a signal path.

(Embodiments of the Disclosure)

The following embodiments show examples of the configuration using an on-chip circuit forming a circuit in a radio IC, as an example of the electronic circuit to which the present disclosure is applied. The on-chip circuit is supposed to be a circuit which includes one of a low noise amplifier and a power amplifier, for example. A millimeter wave signal of several tens GHz is supposed as a signal inputted into and outputted from the circuit. The protection circuit according to each of the embodiments of the present disclosure is provided at the input part or the output part of the on-chip circuit.

The embodiments employ a transformer as an input/output matching circuit for the on-chip circuit. The transformer is provided in a manner of being connected to a circuit at the periphery of the terminal part (pad) of the input or output of the on-chip circuit. In the transformer, function of two inductors which are mutually insulated and magnetically coupled is used.

The on-chip circuit is supposed to be a low noise amplifier provided at the input part of a receiver or a power amplifier provided at the output part of a transmitter, for example. The terminal part side inductor of the transformer connects between the terminal part and the grounding point or an ESD protection circuit (ESD diode circuit). Further, the circuit-side inductor (on-chip circuit-side inductor) of the transformer connects between the input or output of the on-chip circuit and a bias power supply circuit.

Accordingly, the voltage at the terminal part of the input or output and the bias voltage at the on-chip circuit can be isolated to each other without using a capacitance element for isolating DC voltage. Further, since an ESD countermeasure circuit can be configured by using an occupancy area corresponding to one of the inductors constituting the transformer, the increase of the occupancy area is not required in order to enhance the ESD resistance characteristic.

(First Embodiment)

Figure 1:
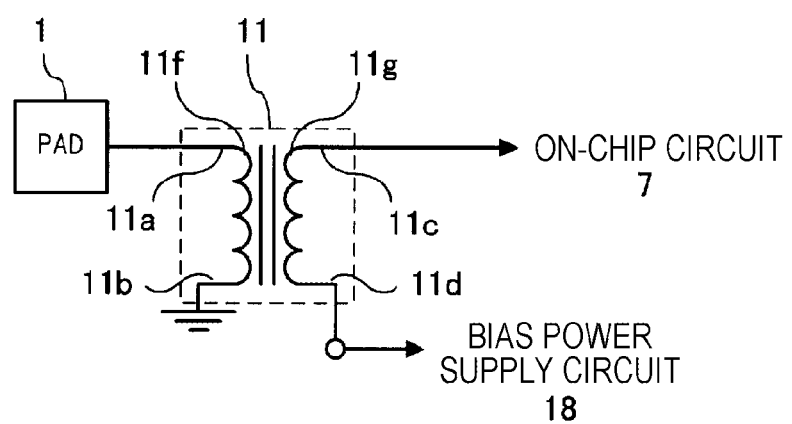
FIG. 1 shows the configuration of a radio circuit provided with a protection circuit according to a first embodiment of the present disclosure.

FIG. 1 shows the configuration of a radio circuit provided with a protection circuit according to the first embodiment of the present disclosure. The protection circuit of the embodiment is provided with a transformer 11 having two inductors and four terminals, as an input/output matching circuit for an on-chip circuit 7. The transformer 11 is not limited to one having two windings so long as it contains two inductors which are mutually insulated and magnetically coupled. For example, the transformer may have three or more windings so long as it is usable according to a situation of the circuit configuration and a mountable occupancy area.

The terminal part (pad) 1 of the radio IC is connected to a terminal 11a of the transformer 11, a grounding point is connected to a terminal 11b thereof, the input or output of the on-chip circuit 7 is connected to a terminal 11c thereof, and a bias power supply circuit 18 is connected to a terminal 11d thereof.

A terminal-side inductor 11f of the transformer 11 is magnetically coupled to a circuit-side inductor (on-chip circuit-side inductor) 11g thereof so that a signal can be transmitted therebetween. However, the terminal-side inductor 11f and the circuit-side inductor 11g are insulated and isolated to each other from a standpoint of DC. Thus, different DC voltages are applied to the terminal part 1 and the input or output of the on-chip circuit 7, respectively.

In the millimeter wave band with a frequency of several tens GHz, since the impedance of the transformer 11 is sufficiently large, a signal is transmitted to the on-chip circuit 7 from the terminal part 1 due to the magnetic coupling. On the other hand, in a frequency lower than the millimeter wave band, since the impedance of the transformer 11 becomes small, the protection circuit shows characteristics similar to those in the case where the terminal 11a and the terminal 11b of the transformer 11 are short-circuited therebetween and the terminal 11c and the terminal 11d thereof are short-circuited therebetween. Accordingly, a low-frequency signal with a large amplitude generated by electro-static discharge flows into the grounding point connected to the terminal 11b of the transformer 11 and hence is prevented from being transmitted to the on-chip circuit 7.

Figure 2:
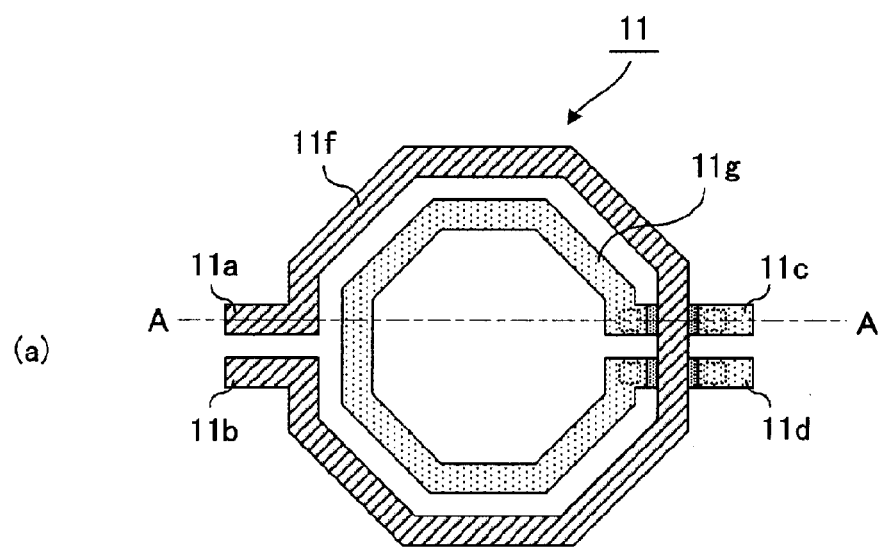
FIG. 2 shows an example of the configuration of a transformer 11 according to the embodiment formed on an IC, in which (a) is a top view thereof and (b) is a sectional view thereof cut along a line A-A in (a).
Figure 2:
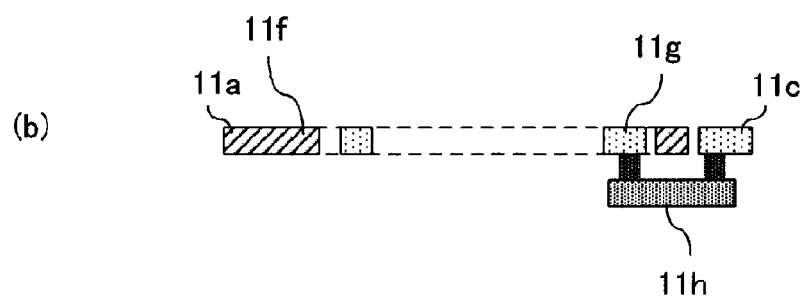

FIG. 2 shows an example of the configuration of the transformer 11 according to this embodiment formed on the IC, in which (a) is the top view thereof and (b) is the sectional view thereof cut along a line A-A in (a). The terminal-side inductor 11f is formed on a semiconductor substrate by a wiring layer of an almost octagonal ring shape. The terminals 11a, 11b are formed at the end portions of the terminal-side inductor 11f, respectively. Further, similarly, the circuit-side inductor 11g is formed by a wiring layer of an almost octagonal ring shape on the inner side (center side of the ring) of the terminal-side inductor 11f. Each of the terminal-side inductor 11f and the circuit-side inductor 11g is formed in the layer of the same plane. The end portions of the circuit-side inductor 11g are connected to the one end portions of the wiring layer 11h via connection conductors in a manner of bypassing the terminal-side inductor 11f, respectively. The other end portions of the wiring layer 11h are connected to the terminals 11c, 11d via connection conductors, respectively.

In the transformer 11 shown in FIGS. 2(a) and (b), each of the two inductor windings is arranged so as to be laminated in the layer of the same plane. Thus, the transformer 11 can be formed by using an occupation area substantially same as that of one of the inductors. On the other hand, each of the transmission lines required in the circuit configurations of the related art shown in FIGS. 11 and 12 needs an area substantially same as that of one of the inductors. Thus, the circuit according to this embodiment shown in FIG. 1 can realize the substantially same function as that of the circuit of the related art shown in FIG. 11 by using an occupancy area almost half of the circuit of the related art.

In this embodiment, since the DC voltage at the outside of the IC and the DC voltage at the input/output of the on-chip circuit can be isolated to each other by using the transformer, the voltage at the terminal part and the bias voltage at the on-chip circuit can be isolated to each other without using a capacitor to be connected in series with the signal path. Further, the impedance can be made low with respect to the signal of the frequency lower than the frequency band of the signal generated by electro-static discharge, without providing a capacitor, by using the transformer. Thus, the electro-static discharge signal can be flown into the ground, thereby preventing the discharge signal from flowing into the on-chip circuit.

In the configuration using the transformer according to this embodiment, since the capacitance element for the ESD protection and the DC voltage isolation from the outside is not necessary, the degradation of performance due to the parasitic capacitance can be suppressed. Further, the resistance characteristic with respect to electro-static discharge can be enhanced without increasing the occupancy area and the protection function can be improved. Further, since the transmission line is not necessary for the ESD protection, the degradation of performance of the electronic circuit can be suppressed and the occupancy area can be reduced. In the case of using the low noise amplifier as the electronic circuit, the gain and the noise performance of the low noise amplifier can be improved by removing the capacitance for DC voltage isolation.

Figure 3:
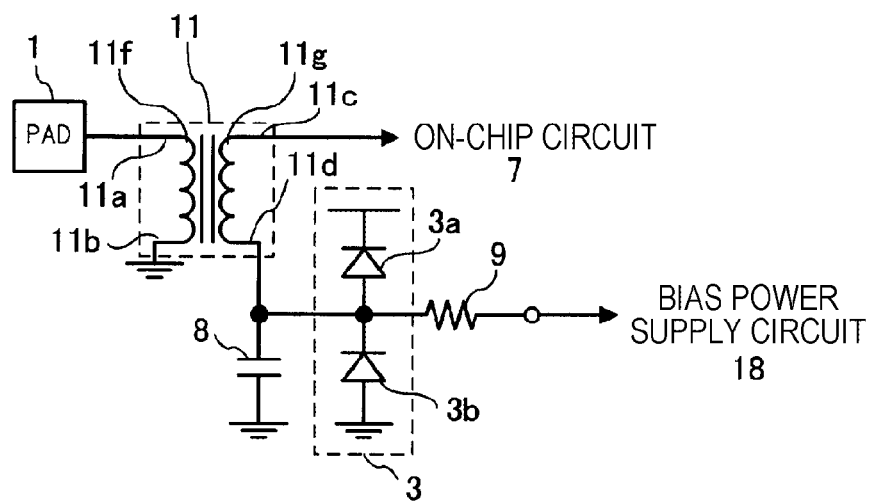
FIG. 3 shows a radio circuit according to a first modified example in which ESD resistance characteristic is enhanced with respect to the configuration of FIG. 1.

FIG. 3 shows a radio circuit according to a first modified example in which the ESD resistance characteristic is enhanced in the configuration of FIG. 1. In the first modified example, an ESD diode circuit 3 and a resistor 9 acting as an ESD protection circuit are connected between the terminal 11d of the transformer 11 and the bias power supply circuit 18, one end of an AC grounding capacitor 8 is connected to a connection point between the terminal 11d and the ESD diode circuit 3, and the other end of the AC grounding capacitor 8 is grounded.

In the ESD diode circuit 3, two diodes 3a, 3b are connected in series, the cathode of the diode 3a is connected to a power supply, and the anode of the other diode 3b is connected to the ground. When the input signal changes to the positive voltage side due to electro-static discharge, the diode 3a is switched into an ON state to thereby flow a current into the diode 3a, thereby preventing the input signal from increasing to the power supply voltage or more. In contrast, when the input signal changes to the negative voltage side, the diode 3b is switched into an ON state to thereby flow a current into the diode 3b, thereby preventing the input signal from reducing to the ground voltage or less.

In the example of the related art shown in FIG. 13, since the withstand voltage of the capacitor 156 is low, it is difficult to insert the ESD countermeasure circuit in the transmission line 155. In contrast, the withstand voltage of the transformer 11 of this embodiment is quite large. Thus, when the ESD diode circuit 3 is connected to the terminal 11d, a low-frequency signal of a large amplitude generated by electro-static discharge can be prevented from inputting into the on-chip circuit 7. Thus, the signal amplitude can be suppressed.

Further, since it is not necessary to add a circuit configuration such as a new line, for example, the enhancement of the ESD resistance characteristic is realized by using an occupation area substantially same as that of the circuit of the embodiment shown in FIG. 1. When compared with the circuit configuration of FIG. 13 which seems to have the substantially same ESD resistance characteristic, the occupancy area can be reduced to almost one third thereof.

Figure 4:
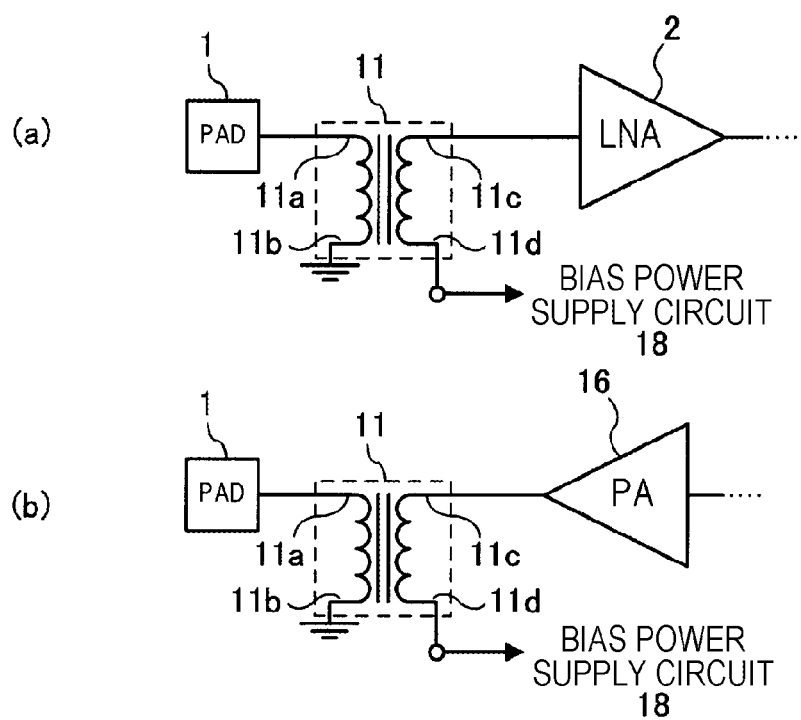
FIG. 4 shows concrete examples of an on-chip circuit to be applied to the radio circuit shown in FIG. 1, in which (a) shows an example of the configuration applied to a reception circuit and (b) shows an example of the configuration applied to a transmission circuit.

This embodiment can be applied to any of a reception circuit and a transmission circuit. FIG. 4 shows concrete examples of the on-chip circuit to be applied to the radio circuit shown in FIG. 1, in which (a) shows an example of the configuration applied to the reception circuit and (b) shows an example of the configuration applied to the transmission circuit.

In the configuration of the reception circuit shown in FIG. 4 (a), a low noise amplifier 2 is provided as the on-chip circuit 7. The input of the low noise amplifier 2 is connected to the terminal 11c of the transformer 11. In the configuration of the transmission circuit shown in FIG. 4 (b), a power amplifier (PA) 16 is provided as the on-chip circuit 7. The output of the power amplifier 16 is connected to the terminal 11c of the transformer 11.

Figure 5:
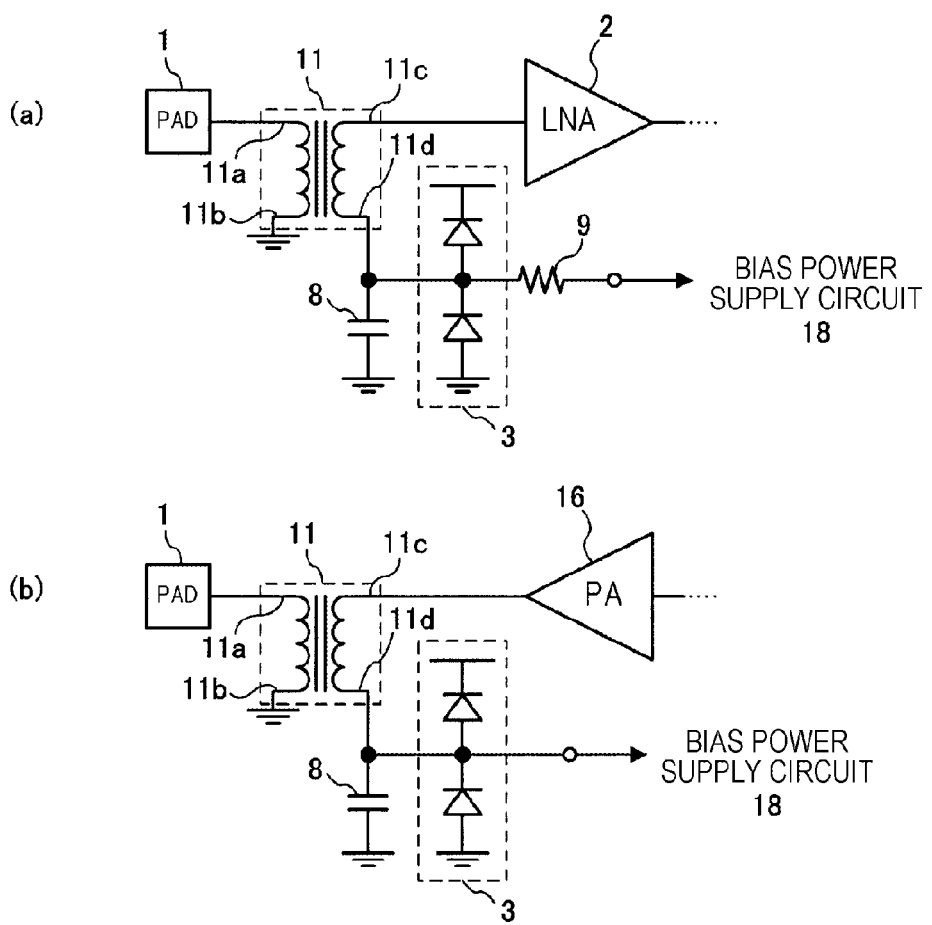
FIG. 5 shows concrete examples of the on-chip circuit to be applied to the radio circuit shown in FIG. 3, in which (a) shows an example of the configuration applied to the reception circuit and (b) shows an example of the configuration applied to the transmission circuit.

FIG. 5 shows concrete examples of the on-chip circuit to be applied to the radio circuit shown in FIG. 3, in which (a) shows an example of the configuration applied to the reception circuit and (b) shows an example of the configuration applied to the transmission circuit.

In the configuration of the reception circuit shown in FIG. 5 (a), the low noise amplifier 2 is provided as the on-chip circuit 7. The input of the low noise amplifier 2 is connected to the terminal 11c of the transformer 11. In the configuration of the transmission circuit shown in FIG. 5 (b), the power amplifier 16 is provided as the on-chip circuit 7. The output of the power amplifier 16 is connected to the terminal 11c of the transformer 11.

The configuration of this embodiment is effective in the reception circuit and the transmission circuit. In the case of enhancing the ESD resistance characteristic of the transmission circuit, since a current flows toward the on-chip circuit 7 from the bias power supply circuit 18, the insertion of the resistor 9 shown in FIG. 3 can be omitted in order to suppress the voltage drop.

Figure 6:
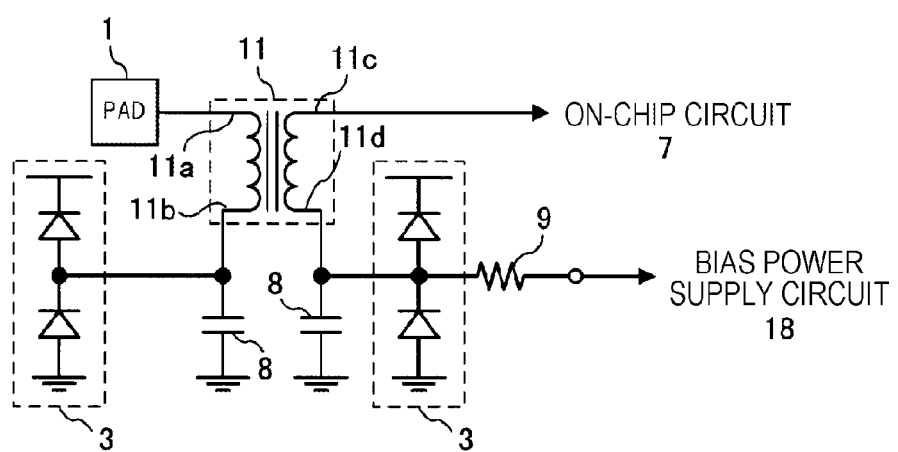
FIG. 6 shows a radio circuit according to a second modified example in which an ESD diode circuit is provided on the terminal part side of the configuration of FIG. 3.

FIG. 6 shows a radio circuit according to a second modified example in which the ESD diode circuit is provided on the terminal part side of the configuration of FIG. 3.

When the voltage of the terminal part 1 is not the ground voltage, the ESD resistance characteristic may be enhanced on the terminal part 1 side as shown in FIG. 6. In the second modified example, the ESD diode circuit 3 is connected to the terminal 11b of the transformer 11, the one end of the AC grounding capacitor 8 is connected to a connection point between the terminal 11b and the ESD diode circuit 3, and the other end of the AC grounding capacitor 8 is grounded. Accordingly, the ESD resistance characteristic can be further enhanced.

Figure 7:
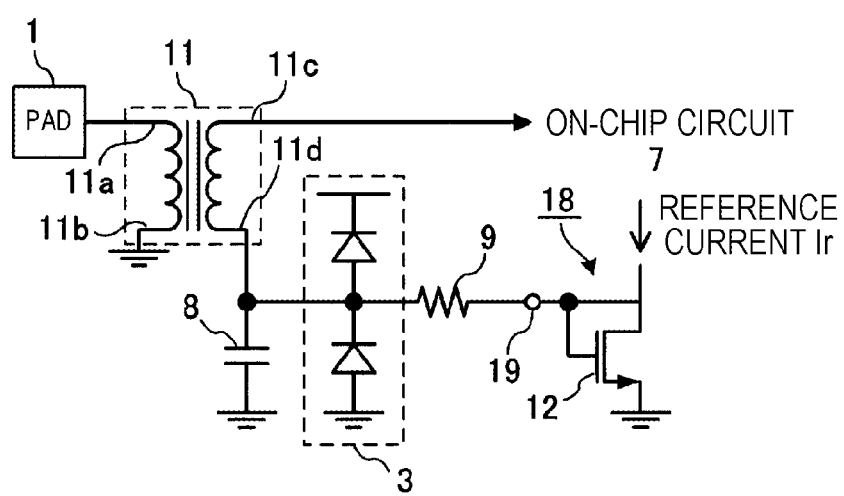
FIG. 7 shows an example of a bias power supply circuit used in this embodiment.

FIG. 7 shows an example of a bias power supply circuit used in this embodiment. The bias power supply circuit 18 has a transistor 12. Each of the gate and the drain of the transistor 12 is connected to a bias power supply terminal 19 and the source thereof is grounded. A desired DC voltage can be generated at the bias power supply terminal 19 by flowing a reference current Ir toward the source from the drain. The bias power supply circuit 18 adjusts a bias voltage based on the ambient temperature change in accordance with the temperature characteristic of the circuit.

Thus, a predetermined bias voltage is applied to the terminal 11d of the transformer 11 via the resistor 9 and the ESD diode circuit 3 from the bias power supply terminal 19. Even when the performance of the transistor changes depending on the temperature, for example, the change of the characteristic of the on-chip circuit 7 can be suppressed by applying the DC voltage using the bias circuit of the transistor 12.

Figure 8:
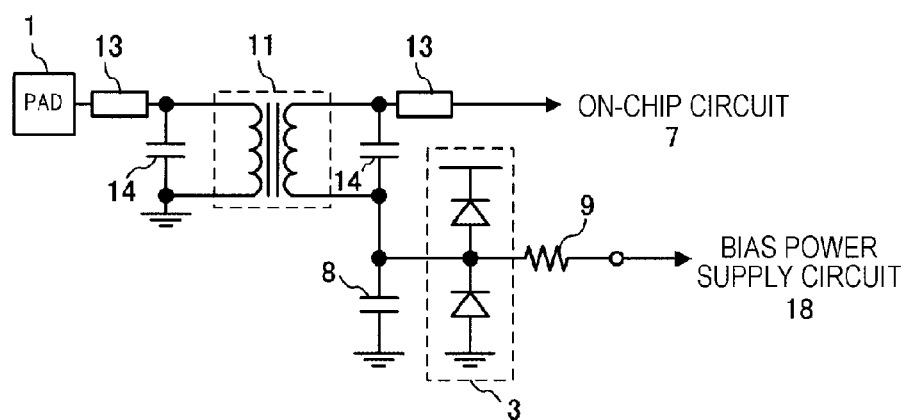
FIG. 8 shows a radio circuit according to a third modified example in which a matching circuit element is provided in the configuration of FIG. 3.

FIG. 8 shows a radio circuit according to a third modified example in which a matching circuit element is provided in the configuration of FIG. 3.

When it is difficult to perform the impedance matching between the outside of the IC and the input or output of the on-chip circuit by using the transformer 11, the matching circuit element may be provided as shown in FIG. 8. In the third modified example, a transmission line 13 is connected between the terminal part 1 and the terminal 11a of the transformer 11 and also between the on-chip circuit 7 and the terminal 11c of the transformer 11. Further, a capacitor 14 is connected between the terminals 11a, 11b of the transformer 11 and also between the terminals 11c, 11d.

Accordingly, the impedances between the outside of the IC and the on-chip circuit can be matched easily. However, if the matching circuit element is added in a situation that the impedance matching is performed by using the transformer 11, the signal transmission characteristic may be degraded.

(Second Embodiment)

Figure 9:
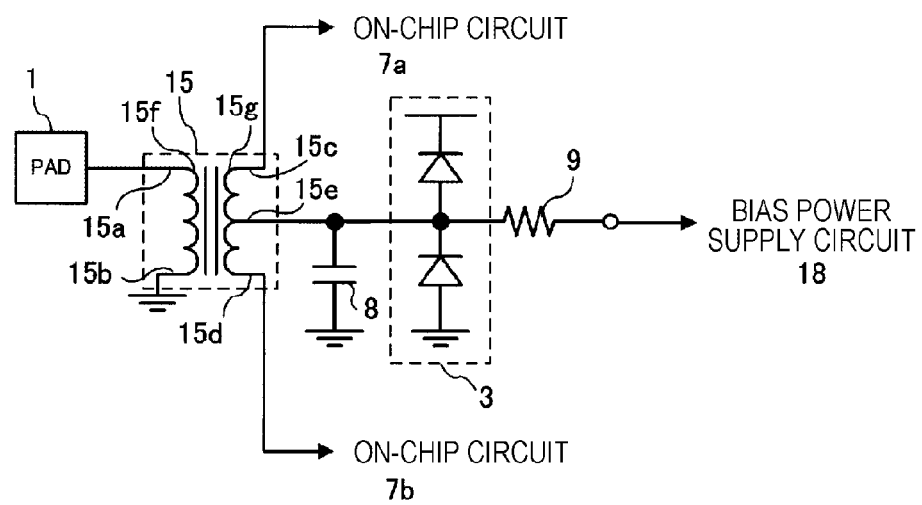
FIG. 9 shows the configuration of a radio circuit provided with a protection circuit according to a second embodiment of the present disclosure.
Figure 10:
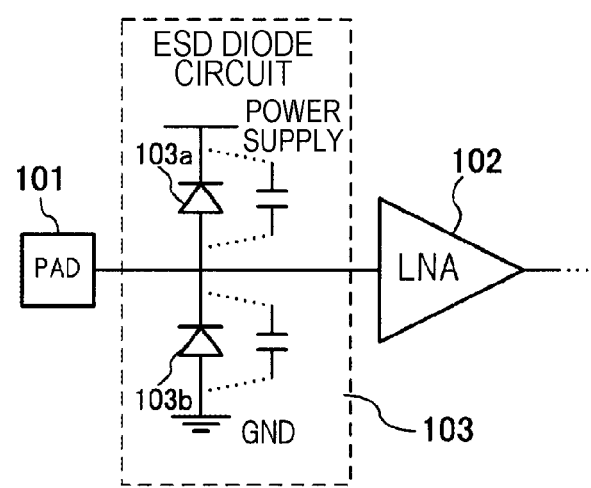
FIG. 10 is a circuit diagram showing an example of the configuration in which an ESD protection circuit is provided at the radio frequency signal input part of the reception block of the radio circuit.

FIG. 9 shows the configuration of a radio circuit provided with a protection circuit according to a second embodiment of the present disclosure. Although the on-chip circuit of the single configuration is supposed in the first embodiment, the present disclosure can be also applied to an on-chip circuit of a differential configuration. An example of the differential configuration is shown in the second embodiment.

The protection circuit of the second embodiment is provided with a transformer 15 which has five terminals including a midpoint terminal 15e on the on-chip circuit-side. The terminal part (pad) 1 of the radio IC is connected to a terminal 15a of the transformer 15, a grounding point is connected to a terminal 15b thereof, the input or output of a first on-chip circuit 7a is connected to a terminal 15c thereof, and the input or output of a second on-chip circuit 7b is connected to a terminal 15d thereof.

Further, the bias power supply circuit 18 is connected to the midpoint terminal 15e via the ESD diode circuit 3 and the resistor 9, the one end of the AC grounding capacitor 8 is connected to the connection point between the midpoint terminal 15e and the ESD diode circuit 3, and the other end of the AC grounding capacitor 8 is grounded. A signal is transmitted between the terminal-side inductor 15f and the circuit-side inductor 15g of the transformer 15 due to the magnetic coupling therebetween. However, the terminal-side inductor and the circuit-side inductor are insulated to each other from a standpoint of DC and hence isolated to each other.

Signals having opposite phases are transmitted to the terminal 15c and the terminal 15d at the both ends of the circuit-side inductor 15g of the transformer 15, respectively. That is, signals having inversed polarities to each other are transmitted to the first on-chip circuit 7a and the second on-chip circuit 7b connected to the terminals 15c, 15d, respectively. Further, since the ESD diode circuit 3 is inserted between the midpoint terminal 15e and the bias power supply circuit 18, the ESD resistance characteristic can be enhanced.

Since the protection circuit using the transformer can be also applied to the differential configuration, like the first embodiment, the degradation of the performance due to the parasitic capacitance can be suppressed. Further, the resistance characteristic with respect to electro-static discharge can be enhanced and the protection function can be improved without increasing the occupancy area.

The present disclosure intends to contain, as a scope of protection, various modifications and applications performed by those skilled in the art based on the present disclosure of the specification and the well known techniques, without departing from the gist and range of the present disclosure. Further, the constituent elements in the above embodiments may be combined arbitrarily within a range not departing from the gist of the present disclosure.

(Summary of Aspects of the Disclosure)

A protection circuit according to a first aspect of the present disclosure includes: a transformer which is provided between a terminal part of an electronic circuit and an input or output of the electronic circuit, the transformer including a plurality of inductors magnetically coupled therebetween, wherein one end and the other end of a terminal-side inductor of the transformer are connected to the terminal part and a ground, respectively, and one end and the other end of a circuit-side inductor of the transformer are connected to the input or output of the electronic circuit and a bias power supply circuit of the electronic circuit, respectively.

A protection circuit according to a second aspect of the present disclosure includes: a transformer which includes, between a terminal part of an electronic circuit and an input or output of the electronic circuit, a plurality of inductors magnetically coupled therebetween, wherein one end and the other end of a terminal-side inductor of the transformer are connected to the terminal part and a ground, respectively, the electronic circuit is a circuit of a differential configuration, and a circuit-side inductor of the transformer has a midpoint terminal, one end of the circuit-side inductor is connected to an input or output of one electronic circuit of the differential configuration, the other end of the circuit-side inductor is connected to an input or output of the other electronic circuit of the differential configuration, and the midpoint terminal is connected to a bias power supply circuit of the electronic circuit.

A protection circuit according to a third aspect of the present disclosure is configured, in the protection circuit according to the first or second aspect, wherein an ESD protection circuit is provided between the other end of the circuit-side inductor and the bias power supply circuit, wherein the ESD protection circuit includes diodes being connected in series, and one end and the other end of the ESD protection circuit are connected to a power supply and a ground, respectively.

A protection circuit according to a fourth aspect of the present disclosure is configured, in the protection circuit according to the third aspect, wherein the ESD protection circuit is provided between the other end of the terminal-side inductor and a ground, and a connection point between the diodes connected in series is connected to the ground via a capacitor.

A protection circuit according to a fifth aspect of the present disclosure is configured, in the protection circuit according to any one of the first to fourth aspects, wherein the electronic circuit is a low noise amplifier provided at a receiver of a wireless device, and the transformer is provided between the terminal part and an input of the low noise amplifier.

A protection circuit according to a sixth aspect of the present disclosure is configured, in the protection circuit according to any one of the first to fourth aspects, wherein the electronic circuit is a power amplifier provided at a transmitter of a wireless device, and the transformer is provided between the terminal part and an output of the power amplifier.

The present application is based on Japanese Patent Application No. 2012-000795 filed on Jan. 5, 2012, the contents of which are incorporated herein by reference.

Industrial Applicability

The present disclosure has technical effects of, in the protection circuit, suppressing the degradation of performance due to the parasitic capacitance and improving the protection function without increasing the occupancy area. The present disclosure is useful as the protection circuit provided in an electronic circuit. For example, the present disclosure is useful as the protection circuit etc. for preventing the breakage of the circuit due to disturbance containing electro-static discharge, in the electronic circuit for inputting a radio frequency signal.

Reference Signs List
1: terminal part (pad)
2: low noise amplifier
3: ESD diode circuit
7, 7a, 7b: on-chip circuit
8: AC grounding capacitor
9: resistor
11, 15: transformer
11a, 11b, 11c, 11d, 15a, 15b, 15c, 15d: terminal
11f, 15f: terminal-side inductor
11g, 15g: circuit-side inductor
11h: wiring layer
12: transistor
13: transmission line
14: capacitor
15e: midpoint terminal
16: power amplifier
18: bias power supply circuit
19: bias power supply terminal

The invention claimed is:

1. A protection circuit comprising:
a transformer which includes, between a terminal part of an electronic circuit and an input or output of the electronic circuit, a plurality of inductors magnetically coupled therebetween, wherein
one end and the other end of a terminal-side inductor of the transformer are connected to the terminal part and a ground, respectively,
the electronic circuit is a circuit of a differential configuration, and
a circuit-side inductor of the transformer has a midpoint terminal, one end of the circuit-side inductor is connected to an input or output of one electronic circuit of the differential configuration, the other end of the circuit-side inductor is connected to an input or output of the other electronic circuit of the differential configuration, and the midpoint terminal is connected to a bias power supply circuit of the electronic circuit, wherein
the bias power supply circuit generates a desired DC voltage at a bias power supply terminal, and the bias power supply circuit has a transistor having a gate, a source, and a drain, and each of the gate and the drain of the transistor is connected to the bias power supply terminal and the source thereof is grounded.

2. The protection circuit according to claim 1, wherein
an ESD protection circuit is provided between the other end of the circuit-side inductor and the bias power supply circuit, wherein the ESD protection circuit includes diodes being connected in series, and one end and the other end of the ESD protection circuit are connected to a power supply and a ground, respectively.

3. The protection circuit according to claim 2, wherein
another ESD protection circuit is provided between the other end of the terminal-side inductor and a ground, wherein said another ESD protection circuit includes diodes being connected in series, and one end and the other end of said another ESD protection circuit are connected to a power supply and a ground, respectively, and a connection point between the diodes connected in series is connected to the ground via a capacitor.

4. The protection circuit according to claim 1, wherein
the electronic circuit is a low noise amplifier provided at a receiver of a wireless device, and
the transformer is provided between the terminal part and an input of the low noise amplifier.

5. The protection circuit according to claim 1, wherein
the electronic circuit is a power amplifier provided at a transmitter of a wireless device, and
the transformer is provided between the terminal part and an output of the power amplifier.

6. The protection circuit according to claim 1, wherein
the bias power supply circuit adjusts the desired DC voltage based on an ambient temperature change in accordance with a temperature characteristic of the electronic circuit.

7. The protection circuit according to claim 1, further comprising:
a capacitor connected at least one of between the one end and the other end of the terminal-side inductor of the transformer and between the one end and the other end of the circuit-side inductor of the transformer.

* * * * *